US008314488B2

(12) United States Patent
Kojima

(10) Patent No.: US 8,314,488 B2
(45) Date of Patent: Nov. 20, 2012

(54) SAMPLE LIQUID SUPPLY CONTAINER, SAMPLE LIQUID SUPPLY CONTAINER SET, AND MICROCHIP SET

(75) Inventor: Kensuke Kojima, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/149,147

(22) Filed: May 31, 2011

(65) Prior Publication Data

US 2011/0304040 A1 Dec. 15, 2011

(30) Foreign Application Priority Data

Jun. 14, 2010 (JP) ................................ 2010-134689

(51) Int. Cl.
*H01L 23/06* (2006.01)

(52) U.S. Cl. ................................ 257/729; 257/E23.191

(58) Field of Classification Search .................. 257/729, 257/E23.191

See application file for complete search history.

(56) References Cited

U.S. PATENT DOCUMENTS

| | | | | |
|---|---|---|---|---|
| 7,682,565 | B2 * | 3/2010 | Linton et al. | 422/68.1 |
| 2009/0220948 | A1 * | 9/2009 | Oviso et al. | 435/6 |
| 2010/0252128 | A1 * | 10/2010 | Gong et al. | 137/561 A |
| 2010/0320441 | A1 * | 12/2010 | Lee | 257/13 |

FOREIGN PATENT DOCUMENTS

| | | |
|---|---|---|
| JP | 2004-219199 | 8/2004 |
| JP | 2009-284769 | 12/2009 |

* cited by examiner

*Primary Examiner* — Luan C Thai

(74) *Attorney, Agent, or Firm* — K&L Gates LLP

(57) ABSTRACT

A sample liquid supply container is disclosed. The sample liquid supply container includes a first region which is depressurized therein and is hermetically sealed, a second region which is able to receive a liquid therein, a first penetration portion, in which an interior of the first region is punctured by a hollow needle from outside, and a second penetration portion, in which an interior of the second region is punctured by the hollow needle inserted into the first penetration portion and reaches inside the first region.

10 Claims, 13 Drawing Sheets

SAMPLE LIQUID SUPPLY CONTAINER, SAMPLE LIQUID SUPPLY CONTAINER SET, AND MICROCHIP SET

CROSS REFERENCES TO RELATED APPLICATIONS

The present disclosure claims priority to Japanese Priority Patent Application JP 2010-134689 filed in the Japan Patent Office on Jun. 14, 2010, the entire contents of which are hereby incorporated by reference.

BACKGROUND

The present disclosure relates to a sample liquid supply container, a sample liquid supply container set, and a microchip set. More particularly, the present disclosure relates to a sample liquid supply container or the like which can easily conduct liquid injection to a region formed in a microchip.

In recent years, microchips have been developed in which a well and/or a channel for performing chemical and biological analyses are provided on a silicon substrate or a glass substrate by application of micro-machining techniques used in the semiconductor industry (for example, refer to Japanese Unexamined Patent Application Publication No. 2004-219199). These microchips have begun to be utilized for electrochemical detectors in liquid chromatography, small electrochemical sensors in medical service sites, and the like.

Analytical systems using such microchips are called μ-TAS (micro-Total-Analysis System), lab-on-a-chip, bio chip or the like, and are paid attention to as a technology by which chemical and biological analyses can be enhanced in speed, efficiency and level of integration or by which analyzing apparatuses can be reduced in size.

The μ-TAS, which enables analysis with a small amount of sample and enables disposable use of microchips, is expected to be applied particularly to biological analyses where precious trace amounts of samples or a multiplicity of specimens are treated.

An application example of the μ-TAS is an optical detection apparatus in which a substance is introduced into a plurality of regions formed on the microchip, and the substance is optically detected. Such an optical detection apparatus includes an electrophoresis apparatus capable of electrophoretically separating a plurality of substances in a channel of the microchip to optically detect the respective separated substances, and a reactive apparatus (for example, a real-time PCR apparatus) capable of proceeding a reaction between a plurality of substances in a well of the microchip to detect optically a created substance.

For the μ-TAS, since the sample is a trace amount, it is difficult to introduce the sample solution into the well or channel. Otherwise, due to the air existing in the well or the like, the introduction of the sample solution may be disturbed or a long time may be taken to introduce the sample solution. In addition, at the time of introducing the sample solution, bubbles may be generated in the well or the like. As a result, there is a problem in that a variation occurs between the amounts of the sample solutions to be introduced into the respective wells or the like, so that analysis precision is deteriorated or analysis efficiency is deteriorated. Moreover, when the samples are heated like the PCR, there is a problem in that the bubbles existing in the well or the like are expanded, the reaction is disturbed, so that analysis precision is deteriorated.

In order to easily inject the sample solution in the μ-TAS, for example, a substrate is disclosed in Japanese Unexamined Patent Application Publication No. 2009-284769, in which the substrate includes a sample introducing portion introducing samples, a plurality of receiving portions receiving the samples, and a plurality of air discharging portions each connected to the respective receiving portions, where two or more of the air discharging portions are communicated with one open channel having one opened terminal. With this substrate, since the air discharging portions are connected to the respective receiving portions, when the sample solution is introduced from the sample introducing portions to the receiving portions, the air existing in the receiving portions is discharged from the air discharging portions, so that the receiving portions can be smoothly filled with the sample solution.

SUMMARY

As described above, with the μ-TAS in the related art, it is difficult to introduce the sample solution into the well or channel, and the introduction of the sample solution may be disturbed or a long time may be taken to introduce the sample solution, due to the air existing in the well or the like. In addition, at the time of introducing the sample solution, bubbles may be generated in the well or the like. For that reason, there is a problem in analysis precision or analysis efficiency.

Accordingly, it is desirable for the present disclosure to provide a sample liquid supply container capable of easily introducing a sample solution in a short time, and obtaining high analysis precision.

In order to solve the above-described problems, there is provided a sample liquid supply container including: a first region which is depressurized therein and is hermetically sealed; a second region which is able to receive a liquid therein; a first penetration portion in which an interior of the first region is punctured by a hollow needle from outside; and a second penetration portion in which an interior of the second region is punctured by the hollow needle inserted into the first penetration portion and reached inside the first region.

In the sample liquid supply container, the first penetration portion and the second penetration portion may be formed by a sealing member having air-tightness and elasticity, through which the hollow needle is able to penetrate.

The sample liquid supply container may further include an inner cylinder for forming the second region in an inner space, and an outer cylinder for receiving at least a portion of the inner cylinder in the inner space. The space formed by an outer surface of the inner cylinder and an inner surface of the outer cylinder may be hermetically sealed to form the first region, and ends of the inner cylinder and the outer cylinder at the same side may be sealed by the sealing member to form the first penetration portion and the second penetration portion.

In addition to the sample liquid supply container, there are provided a sample liquid supply container set including a hollow needle which penetrates an injection region which is an injection object of a sample solution, and a microchip set including a microchip provided with a hermetically sealed injection region which is an injection object of a liquid.

In the sample liquid supply container, the sample liquid supply container set, and the microchip set, the air inside the injection region is suctioned by negative pressure in the first region, and after the inside is depressurized, the sample solution in the second region is able to be introduced into the injection region by using the negative pressure of the injection region. For this reason, it is desirable that the interior of the injection region of the microchip included in the microchip set is at a constant pressure.

In addition, in the microchip, it is desirable that the portion, through which the hollow needle penetrates the interior of the injection region from the exterior, includes a substrate layer having elasticity, through which the hollow needle is able to penetrate, and a self-sealing ability which is created by elastic deformation. Further, it is particularly desirable that a substrate layer having a gas impermeable property is laminated on both surfaces of the substrate layer having the self-sealing ability which is caused by the elastic deformation, and the substrate layer having the gas impermeable property is provided with a punctured hole through which the hollow needle punctures the interior of the injection region from the exterior.

In this instance, the substrate layer having the self-sealing ability by the elastic deformation may be made of a material which is selected from a group consisting of silicon-based elastomer, acrylic-based elastomer, urethane-based elastomer, fluorine-based elastomer, styrene-based elastomer, epoxy-based elastomer, and natural rubber. In addition, the substrate layer having the gas impermeable property may be made of a material which may be selected from a group consisting of glass, plastics, metals, and ceramics.

With the present disclosure, there is provided the sample liquid supply container capable of easily introducing a sample solution in a short time, and obtaining a high analysis precision.

Additional features and advantages are described herein, and will be apparent from the following Detailed Description and the figures.

DETAILED DESCRIPTION

Embodiments of the present application will be described below in detail with reference to the drawings.

In this instance, the embodiments described below each show one example of a typical embodiment according to the present disclosure, and thus the scope of the present disclosure is not to be interpreted in a narrow fashion. The description will be conducted in the following order.

1. Sample liquid supply Container and Sample liquid supply Container Set (1-1) Configuration Outline (1-2) First Embodiment of Sample liquid supply Container (1-3) Second Embodiment of Sample liquid supply Container (1-4) Third Embodiment of Sample liquid supply Container 2. Microchip Set (2-1) First Embodiment of Microchip (2-1-1) Configuration of Microchip and Molding Method thereof.

(2-1-2) Introduction of Sample solution into Microchip (2-2) Second Embodiment of Microchip (2-2-1) Configuration of Microchip and Molding Method thereof.

(2-2-2) Introduction of Sample solution into Microchip

1. Sample Liquid Supply Container and Sample Liquid Supply Container Set

(1-1) Configuration Outline

Figure 1C:
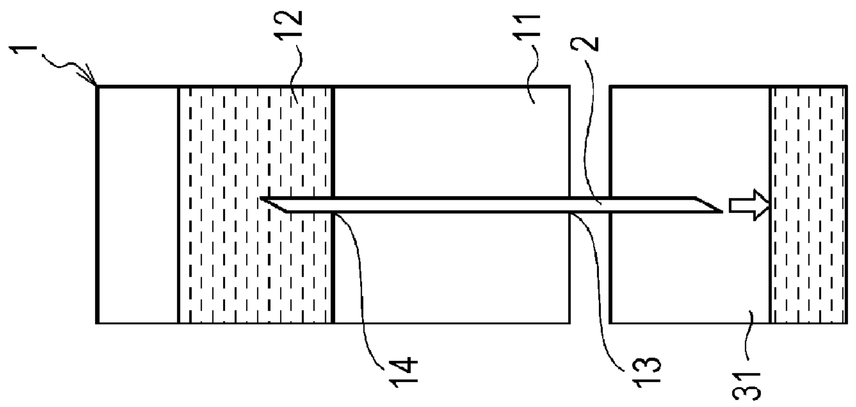
FIGS. 1A to 1C are schematic views conceptually illustrating the configuration of a sample liquid supply container according to the present disclosure.
Figure 1B:
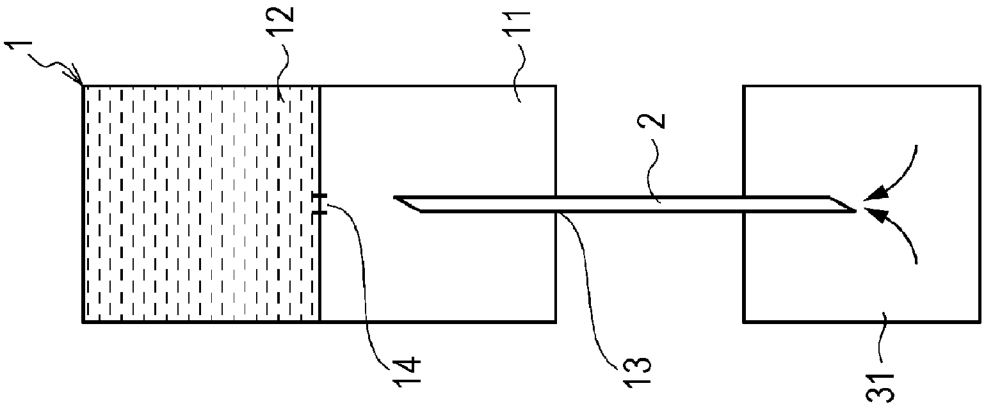
Figure 1A:
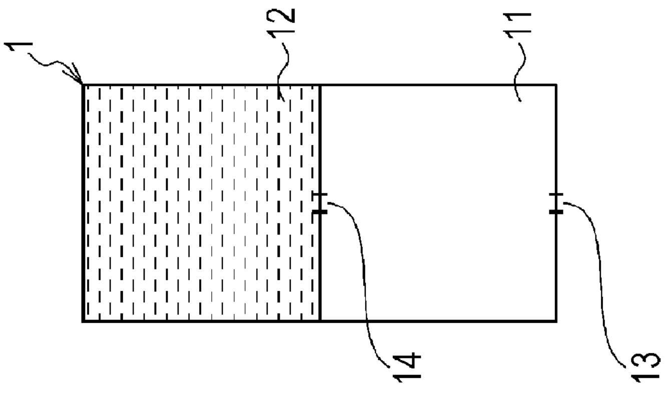

FIGS. 1A to 1C are schematic views conceptually illustrating the configuration of a sample liquid supply container according to the present disclosure.

In the drawings, the sample liquid supply container designated by reference numeral 1 includes a first region 11 which is depressurized therein and is hermetically sealed, and a second region 12 which is able to receive a liquid (sample solution) therein (refer to FIG. 1A). Reference numeral 13 indicates a first penetration portion (refer to FIG. 1B), in which the interior of the first region 11 is punctured by a hollow needle 2 from outside. Reference numeral 14 indicates a second penetration portion (refer to FIG. 1C), in which the interior of the second region 12 is punctured by the hollow needle 2 inserted into the first penetration portion 13 and reaches inside the first region 11. The sample liquid supply container set according to the present disclosure includes the sample liquid supply container 1 and the hollow needle 2.

The first penetration portion 13 and the second penetration portion 14 are formed by a sealing member having air-tightness. Accordingly, the first region 11 is able to maintain a negative pressure (preferably, vacuum pressure) therein, and the second penetration portion 14 is able to maintain the sample solution stored therein. The sealing member forming the first penetration portion 13 and the second penetration portion 14 has elasticity, through which the hollow needle 2 is able to penetrate, in addition to the air-tightness. The material of the sealing member includes various rubbers, such as silicon rubber, and thermoplastic elastomer.

In a case where the sample solution is injected into an injection region 31 which is an injection object of the sample solution, the second region 12 is first filled with the sample solution therein by using the sample liquid supply container set (see FIG. 1A). Next, one end of the hollow needle 2 penetrates the hermetically sealed injection region 31, and the other end penetrates the interior of the first region 11 from the first penetration portion 13 (refer to FIG. 1B). Since the first region 11 is depressurized therein, the front end of the hollow needle 2 reaches the interior of the first region 11, and when the interior of the first region 11 communicates with the interior of the injection region 31 through the hollow needle 2, the air inside the injection region 31 is suctioned by the negative pressure inside the first region 11, so that the injection region 31 is depressurized therein (refer to the arrow in FIG. 1B).

Next, the front end of the hollow needle 2, which is inserted into the first penetration portion 13 and reaches the interior of the first region 11, further penetrates the interior of the second region 12 from the second penetration portion 14 (refer to FIG. 1C). In this instance, since the injection region 31 is depressurized therein, the front end of the hollow needle 2 reaches the interior of the second region 12, and when the interior of the second region 12 communicates with the injection region 31 through the hollow needle 2, the sample solution inside the second region 12 is suctioned by the negative pressure inside the injection region 31, so that the sample solution is introduced into the interior of the injection region 31 (refer to the block arrow in FIG. 1C).

In the sample liquid supply container set according to the present disclosure, the air inside the injection region 31 is suctioned by the negative pressure inside the first region 11, and after the injection region 31 is depressurized therein, the sample solution inside the second region 12 is able to be introduced into the interior of the injection region 31 by using the negative pressure of the injection region 31. Accordingly, without disturbing the injection of the sample solution due to the air existing in the injection region 31, it is possible to smoothly inject the sample solution into the interior of the injection region 31 by a series of operations in a short time. In addition, if the air inside the injection region 31 is completely suctioned, it is possible to introduce the sample solution into the injection region 31 without creating bubbles in the injection region 31.

(1-2) First Embodiment of Sample Liquid Supply Container

Figure 2A:
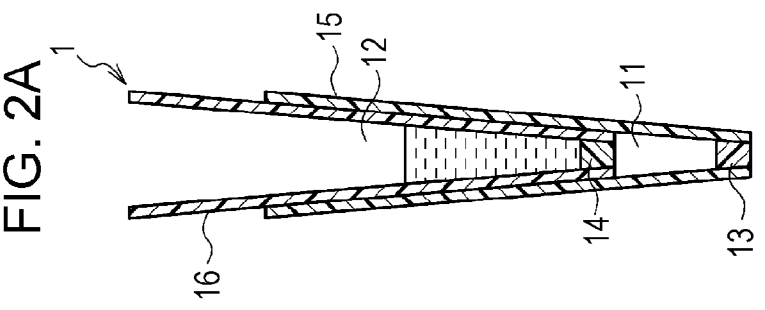
FIGS. 2A to 2C are sectional schematic views illustrating a sample liquid supply container according to a first embodiment of the present disclosure.
Figure 2B:
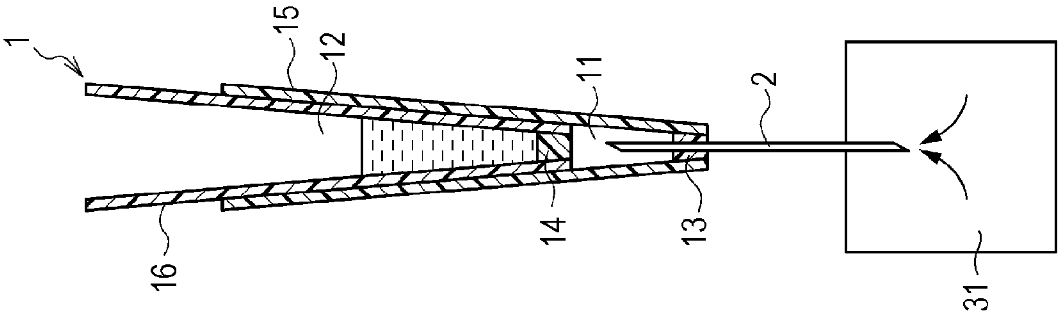
Figure 2C:
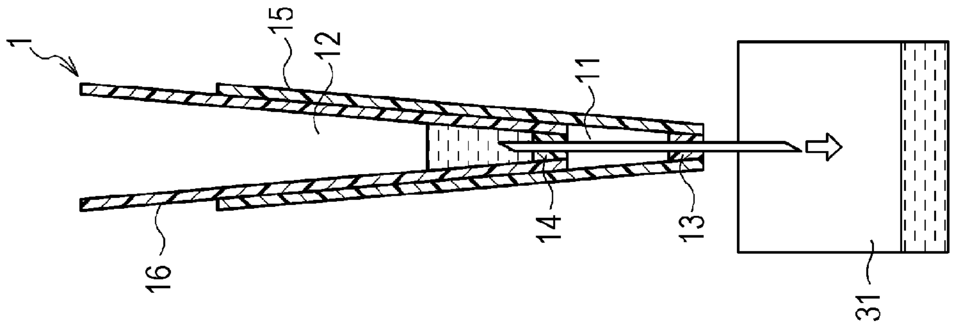

FIGS. 2A to 2C are schematic views illustrating the sample liquid supply container according to the preferred embodiment of the present disclosure.

The sample liquid supply container 1 according to the embodiment includes a pipette chip for a micro pipette. That is, the sample liquid supply container 1 includes a pipette chip (inner cylinder) 16 for forming the second region 12 in an inner space, and a pipette chip (outer cylinder) 15 for receiving at least a portion of the pipette chip 16 in the inner space, as shown in the drawings. The space formed by the outer surface of the pipette chip and the inner surface of the pipette chip 15 is hermetically sealed to form the first region 11, and the front ends of the pipette chips 15 and 16 are sealed by the sealing member to form the first penetration portion 13 and the second penetration portion 14.

The sample liquid supply container 1 according to the embodiment is obtained by preparing the pipette chips 15 and 16 with the front ends sealed by the silicon rubber or the like, and overlapping the front end of the pipette chip 15 over the pipette chip 16 to seal the front end side of the pipette chip 15 in a depressurizing chamber. The sealing between the pipette chip 15 and the pipette chip 16 is able to be obtained by disposing and compressing a rubber ring, such as silicon rubber, between the outer surface of the pipette chip 16 and the inner surface of the pipette chip 15.

In the case where the sample solution is injected into the injection region 31 by using the sample liquid supply container 1 according to the embodiment, the pipette chip 16 (the second region 12) is first filled with the sample solution therein (see FIG. 2A). Next, one end of the hollow needle 2 penetrates the hermetically sealed injection region 31, and the other end penetrates the interior (the first region 11) of the pipette chip 15 from the first penetration portion 13 (refer to FIG. 2B). Since the pipette chip 15 is depressurized therein, the front end of the hollow needle 2 reaches the interior of the pipette chip 15, and when the interior of the pipette chip 15 communicates with the interior of the injection region 31 through the hollow needle 2, the air inside the injection region 31 is suctioned by the negative pressure inside the pipette chip 15, so that the injection region 31 is depressurized therein (refer to the arrow in FIG. 2B).

Next, the front end of the hollow needle 2, which is inserted into the first penetration portion 13 to reach the interior of the pipette chip 15, further penetrates the interior (the second region 12) of the pipette chip 16 from the second penetration portion 14 (refer to FIG. 2C). In this instance, since the injection region 31 is depressurized therein, the front end of the hollow needle 2 reaches the interior of the pipette chip 16, and when the interior of the pipette chip 16 communicates with the injection region 31 through the hollow needle 2, the sample solution inside the pipette chip 16 is suctioned by the negative pressure inside the injection region 31, so that the sample solution is introduced into the interior of the injection region 31 (refer to the block arrow in FIG. 2C).

(1-3) Second Embodiment of Sample Liquid Supply Container

Figures 3A, 3B, 3C:
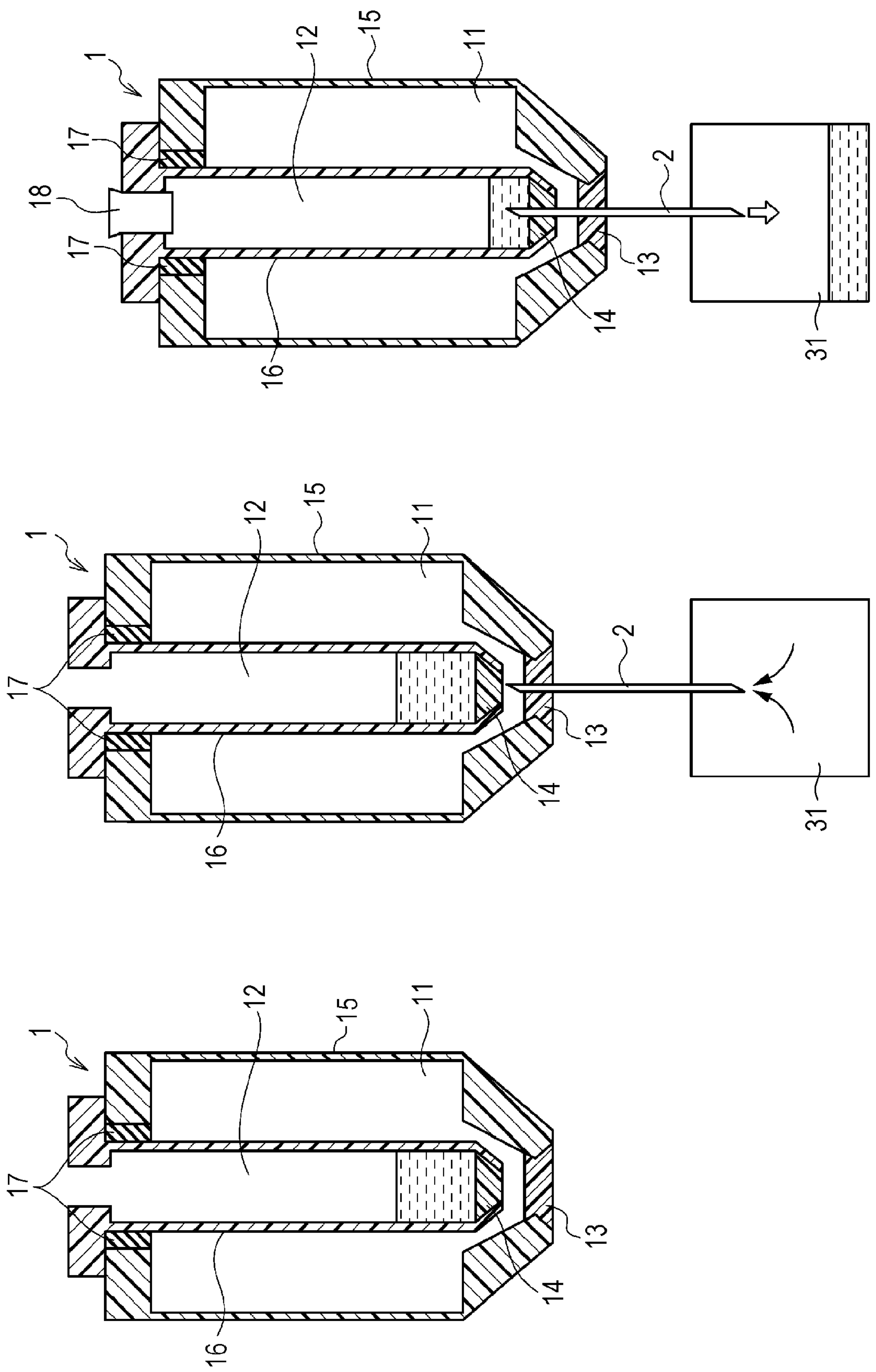
FIGS. 3A to 3C are sectional schematic views illustrating a sample liquid supply container according to a second embodiment of the present disclosure.

FIGS. 3A to 3C are sectional schematic views illustrating the sample liquid supply container according to another preferred embodiment of the present disclosure.

The sample liquid supply container 1 according to the embodiment includes a syringe of an injector. That is, the sample liquid supply container 1 includes a syringe (inner cylinder) 16 for forming the second region 12 in an inner space, and a syringe (outer cylinder) 15 for receiving at least a portion of the pipette chip 16 in the inner space, as shown in the drawings. The space formed by the outer surface of the syringe and the inner surface of the syringe 15 is hermetically sealed to form the first region 11, and the front ends of the syringes 15 and 16 are sealed by the sealing member to form the first penetration portion 13 and the second penetration portion 14.

The sample liquid supply container 1 according to the embodiment is obtained by preparing the large and small syringes 15 and 16 with the front ends sealed by the silicon rubber or the like, and inserting the syringe 16 into the syringe 15 in a depressurizing chamber to seal the syringes. The sealing between the syringe 15 and the syringe 16 is able to be obtained by disposing and compressing a rubber ring, such as silicon rubber, between the outer surface of the syringe 16 and the inner surface of the syringe 15 to form a sealing portion 17.

In the case where the sample solution is injected into the injection region 31 by using the sample liquid supply container 1 according to the embodiment, the syringe 16 (the second region 12) is first filled with the sample solution therein (see FIG. 3A). Next, one end of the hollow needle 2 penetrates the hermetically sealed injection region 31, and the other end penetrates the interior (the first region 11) of the syringe 15 from the first penetration portion 13 (refer to FIG. 3B). Since the pipette chip 15 is depressurized therein, the front end of the hollow needle 2 reaches the interior of the syringe 15, and when the interior of the syringe 15 communicates with the interior of the injection region 31 through the hollow needle 2, the air inside the injection region 31 is suctioned by the negative pressure inside the syringe 15, so that the injection region 31 is depressurized therein (refer to the arrow in FIG. 3B).

Next, the front end of the hollow needle 2, which is inserted into the first penetration portion 13 to reach the interior of the syringe 15, further penetrates the interior (the second region 12) of the syringe 16 from the second penetration portion 14 (refer to FIG. 3C). In this instance, since the injection region 31 is depressurized therein, the front end of the hollow needle 2 reaches the interior of the syringe 16, and when the interior of the syringe 16 communicates with the injection region 31 through the hollow needle 2, the sample solution inside the syringe 16 is suctioned by the negative pressure inside the injection region 31, so that the sample solution 31 is introduced into the interior of the injection region 31 (refer to the block arrow in FIG. 3C).

Figure 4:
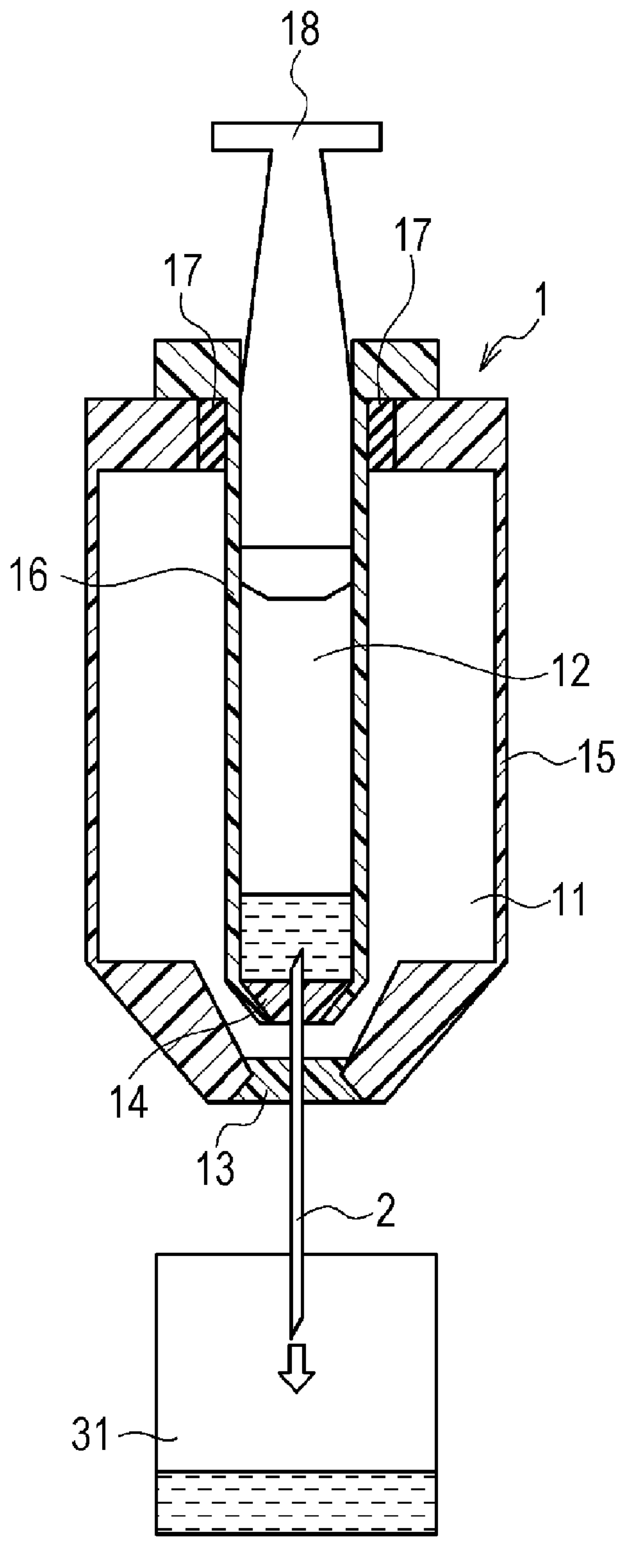
FIG. 4 is a sectional schematic view illustrating a modification of a sample liquid supply container according to a second embodiment of the present disclosure.

In order to further accelerate the injection of the sample solution into the injection region 31 from the syringe 16, a plug 18 is inserted into the syringe 16 from an opening of the end of the syringe 16 opposite to the second penetration portion 14, thereby increasing the internal pressure of the syringe 16. In addition, instead of the plug 18, a plunger 18 of the injector is inserted into the syringe 16 to increase the internal pressure of the syringe 16, thereby delivering the sample solution (refer to FIG. 4).

(1-4) Third Embodiment of Sample Liquid Supply Container

Figure 5A:
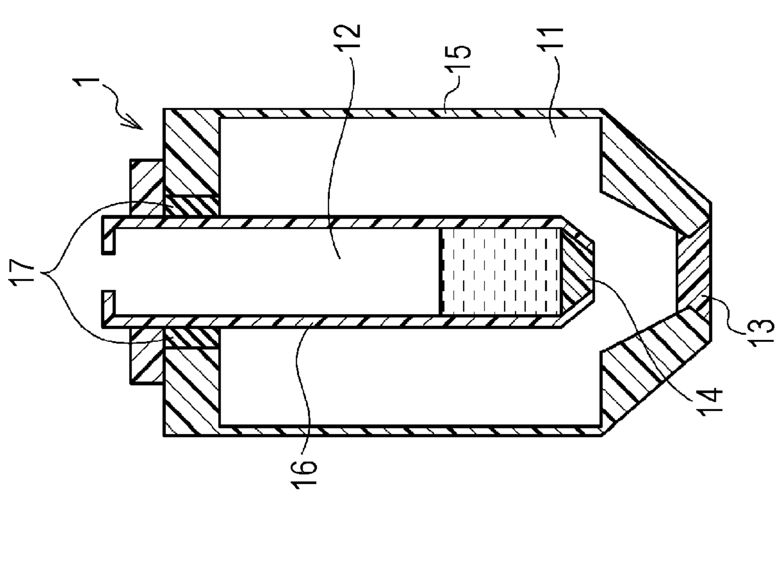
FIGS. 5A to 5C are sectional schematic views illustrating a sample liquid supply container according to a third embodiment of the present disclosure.
Figure 5B:
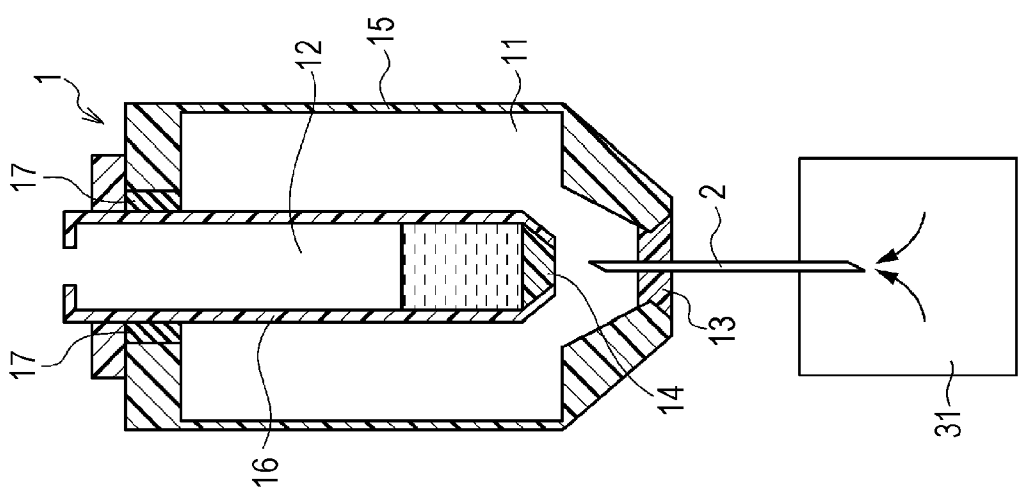
Figure 5C:
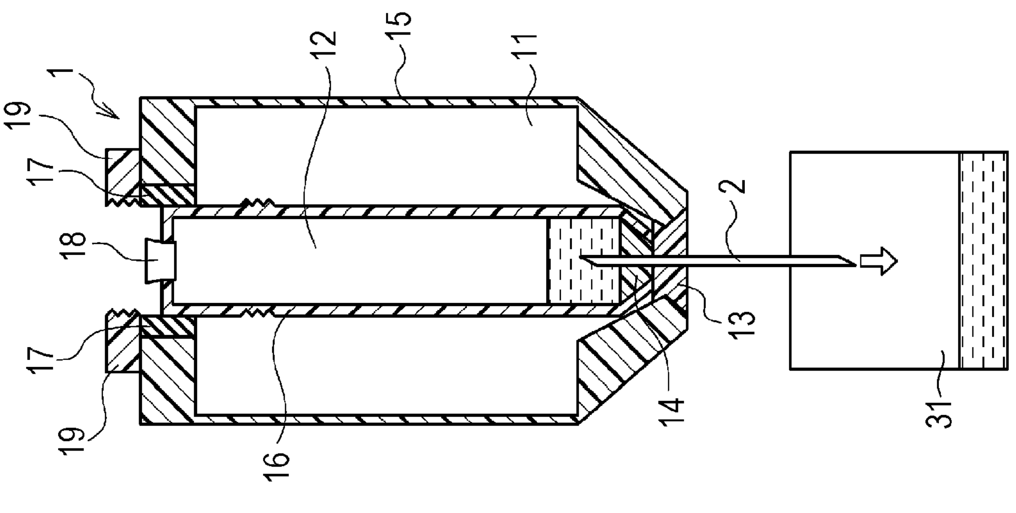

FIGS. 5A to 5C are sectional schematic views illustrating the sample liquid supply container according to another preferred embodiment of the present disclosure.

The sample liquid supply container 1 according to the embodiment includes a syringe of an injector, similar to the container according to the second embodiment described above. That is, the sample liquid supply container 1 includes a syringe (inner cylinder) 16 for forming the second region 12 in an inner space, and a syringe (outer cylinder) 15 for receiving at least a portion of the pipette chip 16 in the inner space. The space formed by the outer surface of the syringe and the inner surface of the syringe 15 is hermetically sealed to form the first region 11, and the front ends of the syringes 15 and 16 are sealed by the sealing member to form the first penetration portion 13 and the second penetration portion 14.

The sample liquid supply container 1 according to the embodiment is obtained by preparing the large and small syringes 15 and 16 with the front ends sealed by the silicon rubber or the like, and inserting the syringe 16 into the syringe 15 in a depressurizing chamber to seal the syringes. The sealing between the syringe 15 and the syringe 16 is able to be obtained by disposing and compressing a rubber ring, such as silicon rubber, between the outer surface of the syringe 16 and the inner surface of the syringe 15 to form a sealing portion 17. The sample liquid supply container 1 according to the embodiment is different from the container according to the second embodiment in the respect that a base portion of the syringe 16 is provided with a flange engaging with the syringe 15, and the flanges are is adapted to be ruptured along a rupture portion 19.

In the case where the sample solution is injected into the injection region 31 by using the sample liquid supply container 1 according to the embodiment, the syringe 16 (the second region 12) is first filled with the sample solution therein (see FIG. 5A). Next, one end of the hollow needle 2 penetrates the hermetically sealed injection region 31, and the other end penetrates the interior (the first region 11) of the syringe 15 from the first penetration portion 13 (refer to FIG. 5B). Since the pipette chip 15 is depressurized therein, the front end of the hollow needle 2 reaches the interior of the syringe 15, and when the interior of the syringe 15 communicates with the interior of the injection region 31 through the hollow needle 2, the air inside the injection region 31 is suctioned by the negative pressure inside the syringe 15, so that the injection region 31 is depressurized therein (refer to the arrow in FIG. 5B).

Next, the syringe 16 is pushed into the syringe 15 by rupturing the rupture portion 19 latching the syringe 16 to the syringe 15. Accordingly, the front end of the hollow needle 2, which is inserted into the first penetration portion 13 to position the interior of the syringe 15, penetrates the second penetration portion 14, and reaches the interior (the second region 12) of the syringe 16, and the interior of the injection region 31 communicates with the interior of the syringe 16 through the hollow needle 2 (refer to FIG. 5C). In this instance, since the injection region 31 is depressurized therein, the sample solution inside the syringe 16 is suctioned by the negative pressure inside the injection region 31, so that the sample solution is introduced into the interior of the injection region 31 (refer to the block arrow in FIG. 5C).

2. Microchip Set (2-1) First Embodiment of Microchip

Next, a microchip set according to the present disclosure will be described. The microchip set includes a microchip provided with a region hermetically sealed which is an injection object of the sample solution, in addition to the sample liquid supply apparatus and the hollow needle which are described above.

(2-1-1) Configuration of Microchip and Molding Method Thereof.

Figure 6:
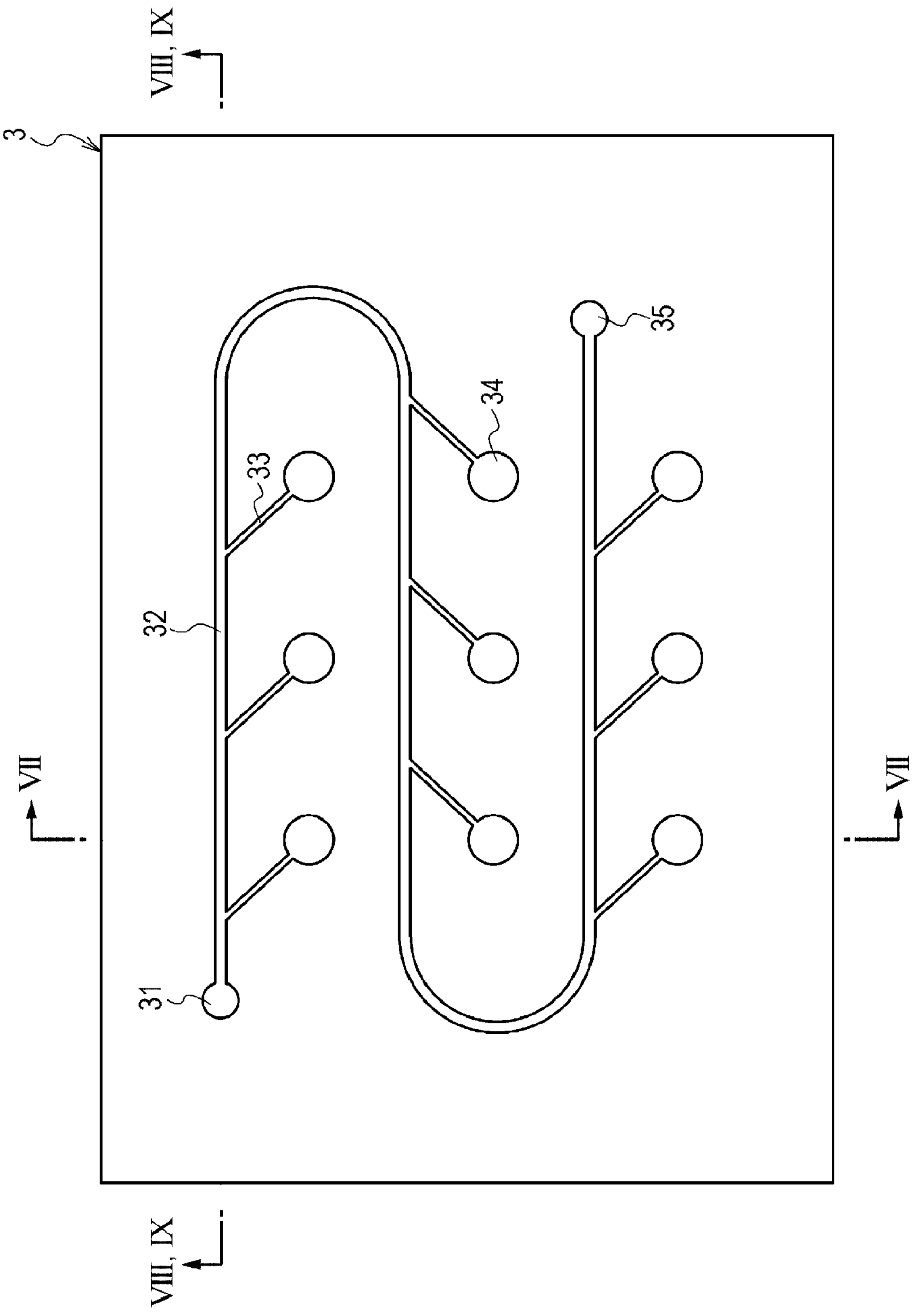
FIG. 6 is a top schematic view illustrating a microchip according to a first embodiment of the present disclosure.
Figure 7:
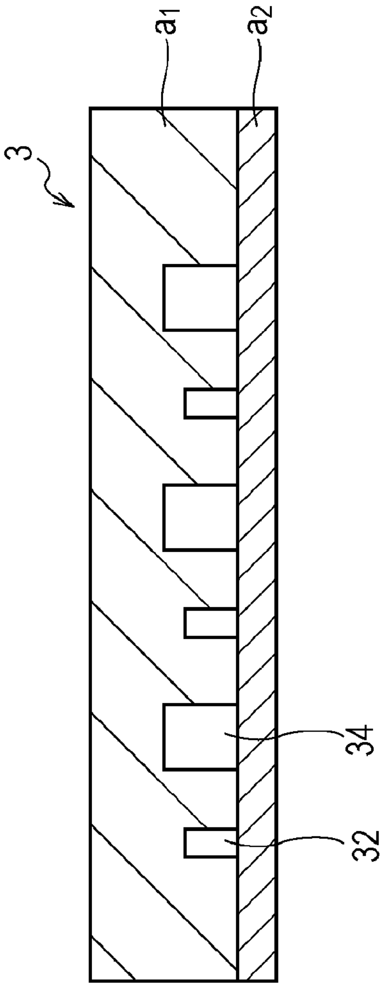
FIG. 7 is a sectional schematic view (a cross-sectional view taken along the line VII-VII in FIG. 6) illustrating a microchip according to a first embodiment of the present disclosure.
Figure 8:
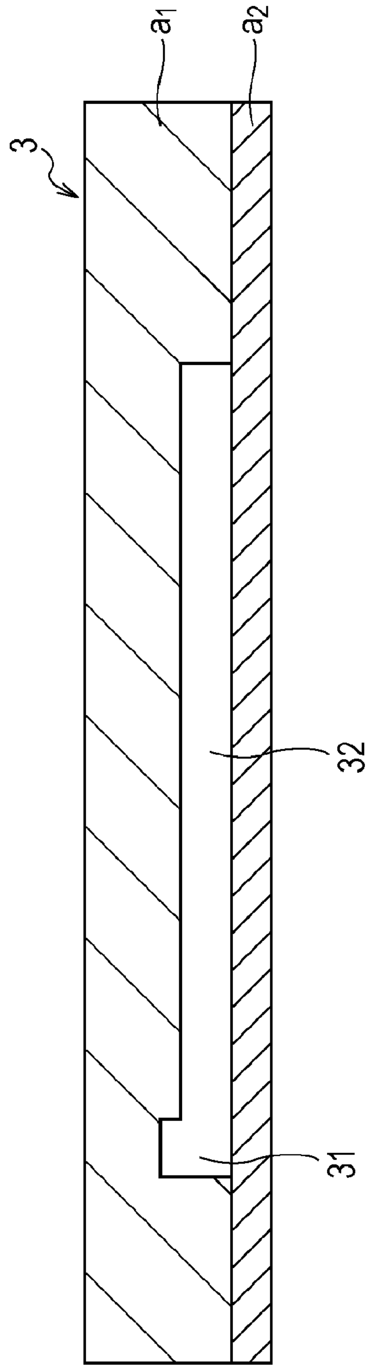
FIG. 8 is a sectional schematic view (a cross-sectional view taken along the line VIII-VIII in FIG. 6) illustrating a microchip according to a first embodiment of the present disclosure.

FIG. 6 is a top schematic view illustrating a microchip according to a first embodiment of the present disclosure, and FIGS. 7 and 8 are sectional schematic views. FIG. 7 is a cross-sectional view taken along the line VII-VII in FIG. 6, and FIG. 8 is a cross-sectional view taken along the line VIII-VIII in FIG. 6.

The microchip, which is designated by reference numeral 3, includes an injection portion 31, through which a sample solution penetrates and is injected from the exterior, a plurality of wells 34 serving as analysis grounds for substances contained in the sample solution or reaction product of the substance, a main channel 32 communicating with the injection portion 31 at one end thereof, and a branch channel 33 branched from the main channel 32. The other end of the main channel 32 is configured as a terminal portion 35, and the branch channel 33 is branched from the main channel 32 between a communicating portion of the injection portion 31 of the main channel 32, and a communicating portion of the terminal portion 35, and then is connected to the respective wells 34.

The injection portion 31, the main channel 32, the branch channel 33, the wells 34 and the terminal portion 35 are an injection region into which the sample solution is injected or introduced.

The microchip 3 is configured by attaching a substrate layer $a_2$ to a substrate layer $a_1$ formed with the injection portion 31, the main channel 32, the branch channel 33, the wells 34 and the terminal portion 35, and hermetically sealing the injection region such as injection portion 31.

The material of the substrate layers $a_1$ and $a_2$ includes glass or various plastics (polypropylene, polycarbonate, cycloolefin polymer, or polydimethylsiloxane), but it is desirable that at least one of the substrate layers $a_1$ and $a_2$ is made of an elastic material. The elastic material includes acrylic-based elastomer, urethane-based elastomer, fluorine-based elastomer, styrene-based elastomer, epoxy-based elastomer, and natural rubber, in addition to silicon-based elastomer such as polydimethylsiloxane (PDMS). It is possible to provide the microchip 3 with the elasticity, through which the hollow needle penetrates, and a self-sealing ability which is created by elastic deformation by forming at least one of the substrate layers $a_1$ and $a_2$ with the elastic material. (The self-sealing ability will be described in detail later.)

In a case where the analysis of the substance introduced into the well 34 is optically performed, it is desirable to select a material with a small optical error, since the material of the substrate layers $a_1$ and $a_2$ have optical transparency, autofluorescence is small, and wavelength dispersion is small.

The molding of the injection portion 31, the main channel 32, the branch channel 33, the wells 34 and the terminal portion 35 on the substrate layer $a_1$ is able to be performed by, for example, wet etching or dry etching a substrate layer made of glass, or nano-imprinting, injection molding or cut machining a substrate layer made of plastic. The injection portion 31 or the like may be formed on the substrate layer $a_2$, a portion of the injection portion 31 may be formed on the substrate layer $a_1$ and the remainder may be formed on the substrate layer $a_2$. In addition, the attachment of the substrate layer $a_1$ and the substrate layer $a_2$ may be performed by, for example, general methods such as thermal fusion bonding, an adhesive, anodic bonding, bonding using an adhesive sheet, plasma-activated bonding, ultrasonic bonding, or the like.

(2-1-2) Introduction of Sample Solution into Microchip

Next, a method of introducing the sample solution into the microchip according to the embodiment will be described with reference to FIGS. 9A to 9D. FIGS. 9A to 9D are sectional schematic views illustrating the microchip, the sample liquid supply container, and the hollow needle, and correspond to the sectional view taken along the line IX-IX in FIG. 6. Herein, the case where the container according to the first embodiment described above will be explained as an example of the sample liquid supply container.

Figure 9A:
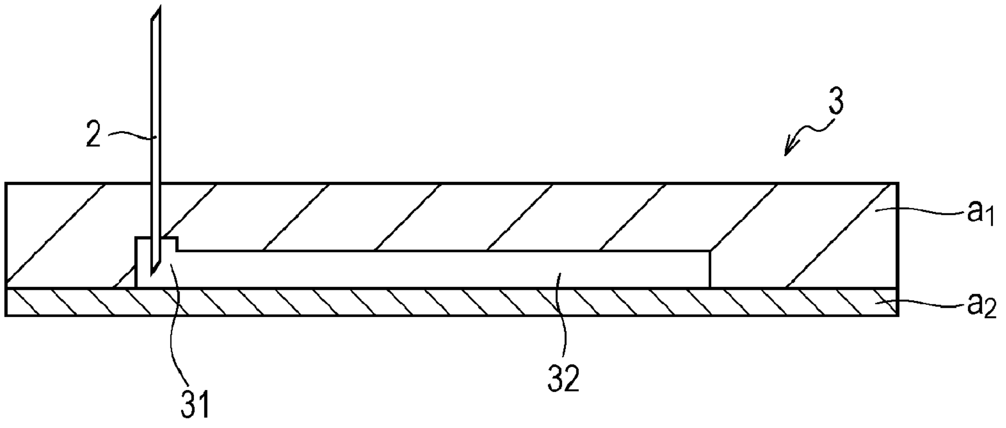
FIGS. 9A and 9B are sectional schematic views illustrating a process of introducing a sample solution to a microchip according to a first embodiment by using a sample liquid supply container according to a first embodiment.

First, as shown in FIG. 9A, the injection portion 31 is penetrated by the hollow needle 2. The hollow needle 2 penetrates and punctures the substrate layer $a_1$ so that the front end reaches the inner space of the injection portion 31 from the surface of the substrate layer $a_1$.

Figure 9B:
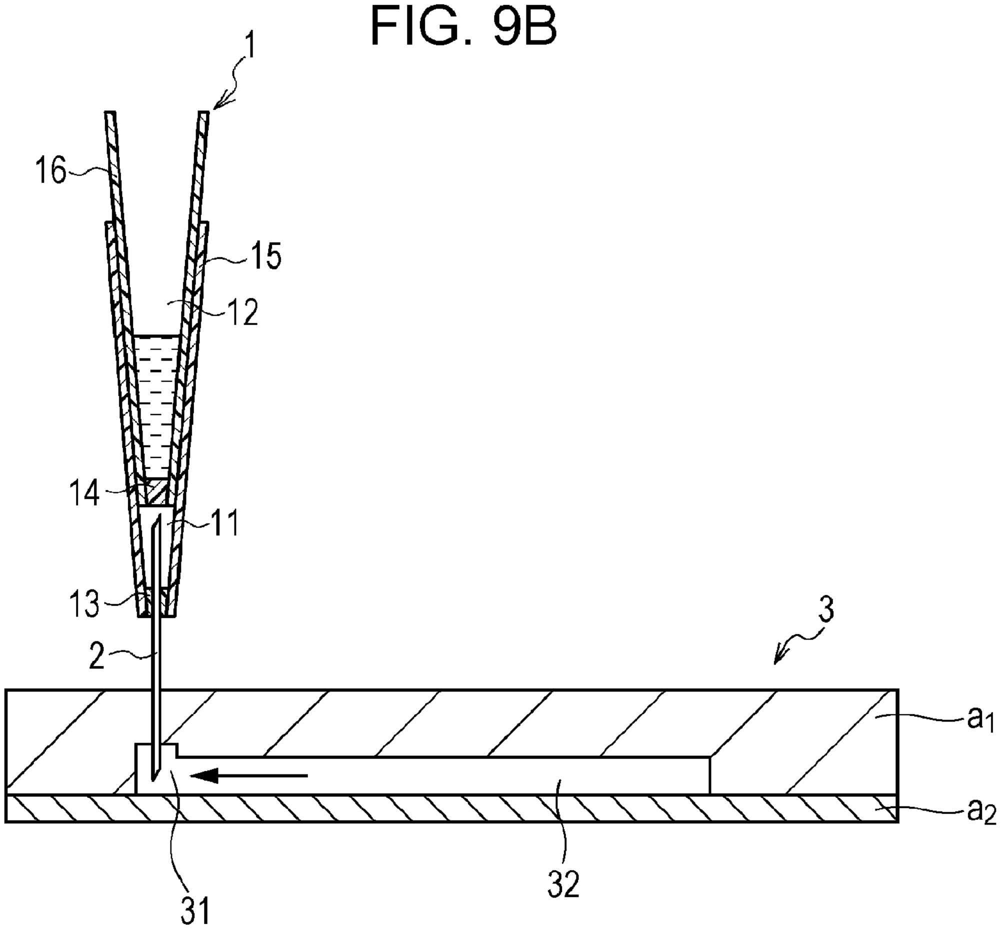

Next, one end of the hollow needle 2 penetrates the interior of the first region 11 from the first penetration portion 13 of the sample liquid supply container 1 in which the second region 12 is filled with the sample solution therein (refer to FIG. 9B). Since the first region 11 is depressurized therein, the front end of the hollow needle 2 reaches the interior of the first region 11, and when the interior of the first region 11 communicates with the interior of the injection region 31 through the hollow needle 2, the air inside the injection region (the injection portion 31, the main channel 32, the branch channel 33, the wells 34 and the terminal portion 35) is suctioned by the negative pressure inside the first region 11, so that the injection region is depressurized therein (refer to the arrow in FIG. 9B).

Figure 9C:
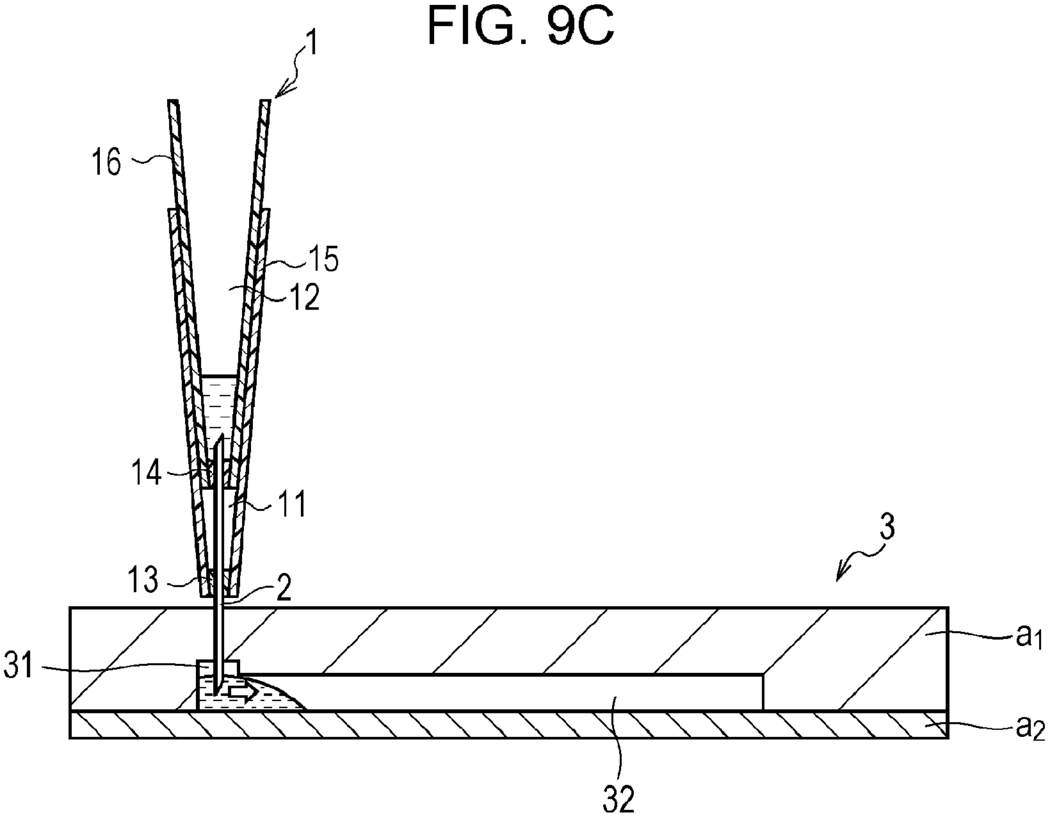
FIGS. 9C and 9D are sectional schematic views illustrating a process of introducing a sample solution to a microchip according to a first embodiment by using a sample liquid supply container according to a first embodiment.

Next, the front end of the hollow needle 2, which is inserted into the first penetration portion 13 to reach the interior of the first region 11, further penetrates the second region 12 from the second penetration portion 14 (refer to FIG. 9C). In this instance, since the injection region is depressurized therein, the front end of the hollow needle 2 reaches the second region 12, and when the interior of the second region 12 communicates with the interior of the injection region through the hollow needle 2, the sample solution inside the second region 12 is suctioned by the negative pressure inside the injection region, so that the sample solution is introduced into the interior of the injection region (refer to the block arrow in FIG. 9C).

In this way, the sample solution introduced from the injection portion 31 is fed to the terminal 35 through the main channel 32 (refer to the block arrow in FIG. 9C), and the sample solution is introduced into the interior in order from the branch channel 33 and the well 34 which are disposed at the upstream side in a liquid feeding direction (refer to FIG. 6). In this instance, since the interior of the injection portion 31, the main channel 32, the branch channel 33, the well 34 and the terminal portion 35 is depressurized, the sample solution introduced into the injection portion 31 is suctioned by the negative pressure, and thus is fed to the terminal portion 35.

As described above, with the microchip set according to the present disclosure the air inside the injection region is able to be suctioned by the negative pressure inside the first region 11, and after the interior is depressurized, the sample solution inside the second region 12 is able to be introduced into the injection region by using the negative pressure of the injection region. Accordingly, the introduction of the sample solution is not disturbed by the air existing in the injection region, and the sample solution is able to be smoothly injected into the injection region by a series of operations in a short period of time. In addition, if the air in the injection region is completely suctioned, it is possible to introduce the sample solution without generating bubbles in the injection region.

Further, since the interior of the injection region is able to be depressurized by the negative pressure inside the first region 11, the attachment of the substrate layer $a_2$ to the substrate layer $a_1$ is carried out under the reduced pressure state (vacuum state). Therefore, it is possible to simplify the process of fabricating the microchip, as compared with the case where the injection region, such as the injection portion 31, is placed under negative pressure in advance. That is, in the microchip set according to the present disclosure, since the interior of the injection region is under normal pressure, the attachment of the substrate layers $a_1$ and $a_2$ is able to be carried out under the normal pressure.

Moreover, a method of exerting the negative pressure in advance onto the injection region by carrying out the attachment of the substrate layers under the reduced pressure has a problem in that a degree of reduced pressure in the injection region is lowered during a storage period of chips, or a problem in that the injection of the sample solution is conducted once. By contrast, in the microchip set according to the present disclosure, since the interior of the injection region is able to be depressurized by the negative pressure inside the first region 11 whenever the sample solution is injected, there is no problem in that a degree of the reduced pressure is lowered during the storage period, and it is possible to repeatedly conduct the injection of the sample solution.

Figure 9D:
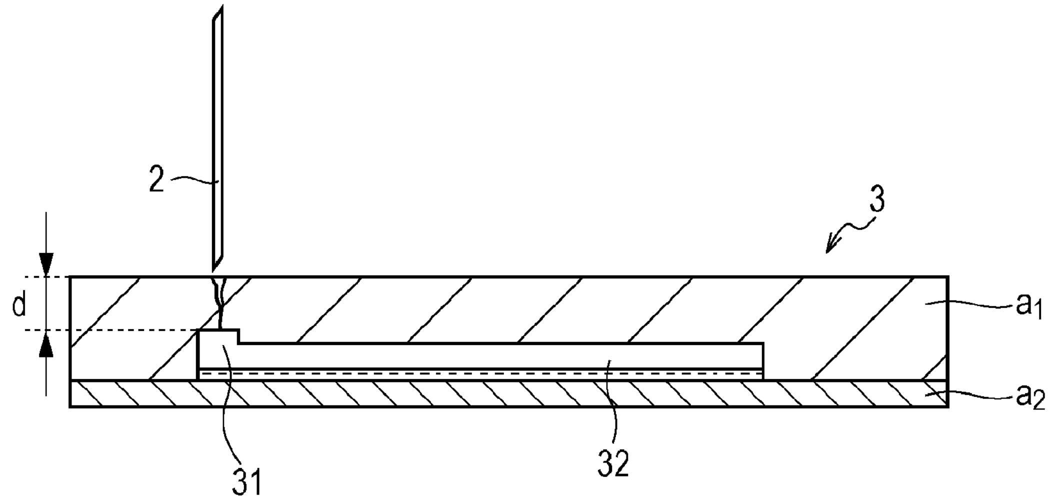
Figure 10:
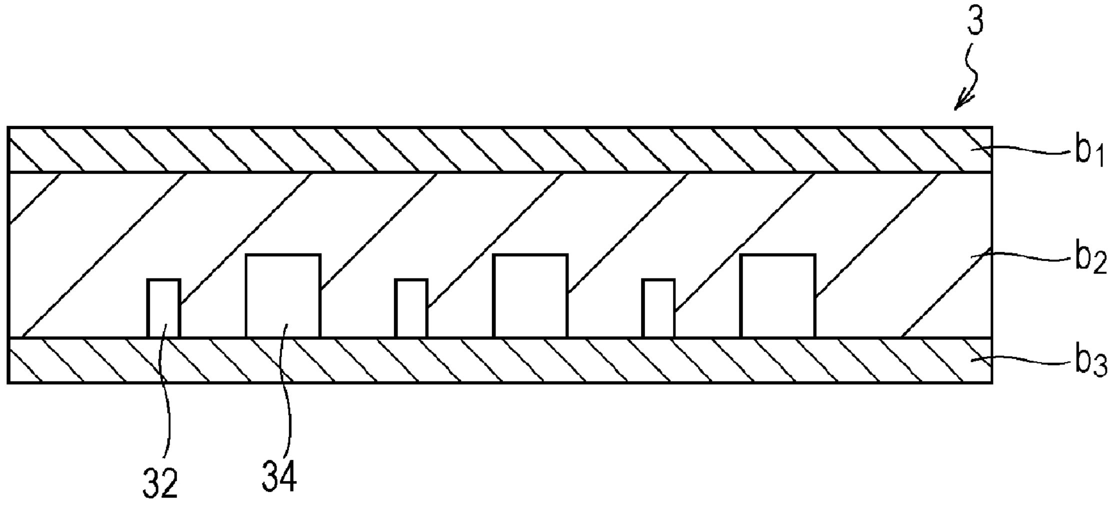
FIG. 10 is a sectional schematic view illustrating a microchip according to a second embodiment of the present disclosure.

After the sample solution is introduced, as shown in FIG. 9D, the hollow needle 2 is withdrawn, and the punctured portion of the substrate layer $a_1$ is sealed. The sample liquid supply container 1 and the hollow needle 2 after use are may be disposable.

In addition, since the substrate layer $a_1$ is made of the elastic material such as PDMS, the punctured portion is able to be naturally sealed by a restoring force of the substrate layer $a_1$ by elastic deformation thereof after the hollow needle 2 is withdrawn. In the present disclosure, the natural sealing of the needle punctured portion by the elastic deformation of the substrate layer is defined by the "self-sealing ability" of the substrate layer.

In order to improve the self-sealing ability of the substrate layer $a_1$, the thickness (refer to the symbol d in FIG. 9D) from the surface of the substrate layer $a_1$ to the surface of the inner space in the injection portion 31 in the punctured portion is necessarily set within an appropriate range depending upon the material of the substrate layer $a_1$ and the diameter of the hollow needle 2. In addition, in a case where the microchip 3 is heated at the time of analysis, it is necessary to set the thickness d so as not to lose the self-sealing ability due to the increased internal pressure resulting from the heating.

In order to ensure the self-sealing ability of the substrate layer a1 by the elastic deformation, it is desirable to use the hollow needle 2 with a small diameter based on the condition that the sample solution is able to be injected. Specifically, a painless needle having a front end of 0.2 mm in outer diameter which is used as an insulin injection needle is appropriately used.

In the case where the painless needle having the front end of 0.2 mm in outer diameter is used as the hollow needle 2, it is desirable that the thickness d of the substrate layer $a_1$ made of PDMS is 0.5 mm or more, or is 0.7 mm or more if the substrate layer is subjected to heating.

The case where 9 wells 34 are disposed three by three at regular intervals on the microchip 3 is explained as an example in this embodiment, but the number of the wells or the installed position is able to be arbitrarily set. The shape of the well 34 is not limited to the cylindrical shape shown in the drawings. In addition, the installed positions of the main channel 32 and the branch channel 33 for feeding the sample solution, which is introduced into the injection portion 31, to the respective wells 34 are not limited to the embodiments shown in the drawings. Further, the case where the substrate layer $a_1$ is made of the elastic material and the hollow needle 2 punctures from the surface of the substrate layer $a_1$ is described herein. However, the hollow needle 2 may puncture from the surface of the substrate layer $a_2$. In this instance, the substrate layer $a_2$ is made of the elastic material to give the substrate layer the self-sealing ability.

(2-2) Second Embodiment of Microchip (2-2-1) Configuration of Microchip and Molding Method Thereof.

FIGS. 10 and 11A to 11D are sectional schematic views illustrating a microchip according to a second embodiment of the present disclosure.

The microchip, which is designated by reference numeral 3, includes an injection portion 31, through which a sample solution penetrates and is injected from the exterior, a plurality of wells 34 serving as analysis grounds for substances contained in the sample solution or reaction product of the substance, a main channel 32 communicating with the injection portion 31 at one end thereof. In addition, although not shown herein, the microchip 3 is provided with a branch channel 33 and a terminal portion (terminal region) 35 which are identical to those in the microchip according to the first embodiment described above.

The injection portion 31, the main channel 32, the branch channel 33, the wells 34 and the terminal portion 35 are an injection region into which the sample solution is injected or introduced.

The microchip 3 is configured by attaching a substrate layer $b_3$ to a substrate layer $b_2$ formed with the injection portion 31, the main channel 32, the branch channel 33, the wells 34 and the terminal portion 35, and hermetically sealing the injection region such as injection portion 31.

The substrate layers $b_2$ are made of a material has the elasticity, through which the hollow needle penetrates, and a self-sealing ability which is created by elastic deformation, such as acrylic-based elastomer, urethane-based elastomer, fluorine-based elastomer, styrene-based elastomer, epoxy-based elastomer, and natural rubber, in addition to silicon-based elastomer such as polydimethylsiloxane (PDMS). The molding of the injection portion 31, the main channel 32, the branch channel 33, the wells 34 and the terminal portion 35 on the substrate layer $b_2$ is able to be performed by, for example, nano-imprinting, injection molding or cut machining.

The PDMS or the like has not only flexible and elastically deformable properties, but also a gas permeable property. For this reason, in the substrate layer made of the PDMS, there is a case where the evaporated sample solution permeates the substrate layer when the sample solution introduced into the well is heated. Disappearance (liquid loss) caused by the evaporation of the sample solution makes analysis precision lower, and is the cause of new bubble inclusion in the well.

In order to prevent this, the microchip 3 has three-layered structure in which substrate layers $b_1$ and $b_3$ having a gas impermeable property are attached to the substrate layer $b_2$ having the self-sealing ability.

The material of the substrate layers $b_1$ and $b_3$ having a gas impermeable property may include glass, plastics, metals, and ceramics.

The plastics include PMMA (polymethyl methacrylate: acrylic resin), PC (polycarbonate), PS (polystyrene), PP (polypropylene), PE (polyethylene), PET (polyethylene terephthalate), diethylene glycol bis allyl carbonate, SAN resin(styrene-acrylonitrile copolymer), MS resin (MMA-styrene copolymer), TPX (poly(4-methyl penten-1)), polyolefin, SiMA (siloxanyl methacrylate monomer)-MMA copolymer, SiMA-fluorine containing monomer copolymer, silicon macromer-(A)-HFBuMA (heptafluorobutyl methacrylate)-MMA terpolymer, and disubstituted polyacetylene-based polymer.

The metals include aluminum, copper, stainless (SUS), silicon, titanium, and tungsten.

The ceramics include alumina ($Al_2O_3$), nitrogen aluminum (AlN), carbonized silicon (SiC), oxidized titanium ($TiO_2$), oxidized zirconia ($ZrO_2$), and quartz.

In a case where the analysis of the substance introduced into the well 4 is optically performed, it is desirable to select a material with a small optical error, since the material of the substrate layers $b_1$ to $b_3$ have optical transparency, auto-fluorescence is small, and wavelength dispersion is small.

The attachment of the substrate layers $b_1$ to $b_3$ may be performed by, for example, general methods such as thermal fusion bonding, an adhesive, anodic bonding, bonding using an adhesive sheet, plasma-activated bonding, ultrasonic bonding, or the like.

(2-2-2) Introduction of Sample Solution into Microchip

Next, a method of introducing the sample solution into the microchip according to the embodiment will be described with reference to FIGS. 11A to 11D. FIGS. 11A to 11D are sectional schematic views illustrating the microchip, the sample liquid supply container, and the hollow needle.

Herein, the case where the container according to the second embodiment described above will be explained as an example of the sample liquid supply container.

Figure 11A:
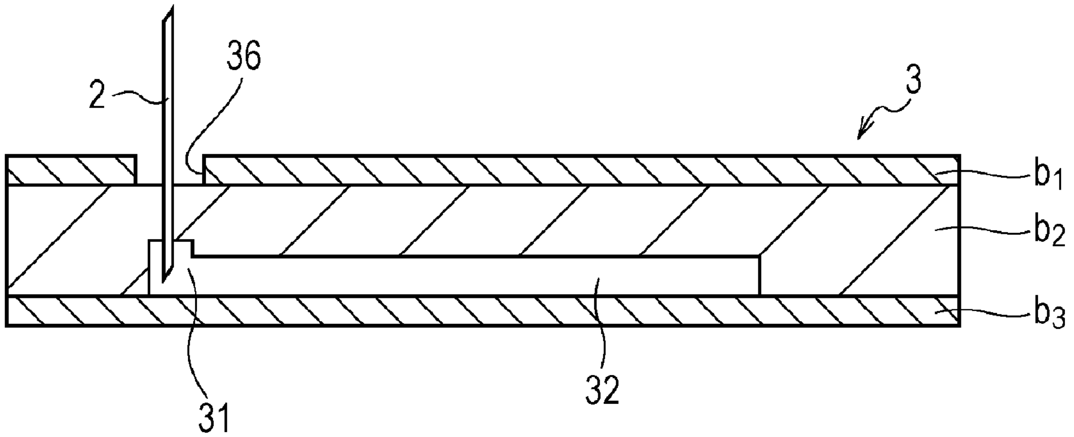
FIGS. 11A and 11B are sectional schematic views illustrating a process of introducing a sample solution to a microchip according to a second embodiment by using a sample liquid supply container according to a second embodiment.

First, as shown in FIG. 11A, the injection portion 31 is penetrated by the hollow needle 2. The substrate layer $b_1$ is provided with a punctured hole 36 for puncturing and injecting the sample solution into the injection portion 31 from the exterior. The hollow needle 2 is inserted into the punctured hole 36, and penetrates the substrate layer $b_2$ so that the front end reaches the inner space of the injection portion 31 from the surface of the substrate layer $b_2$.

Figure 12:
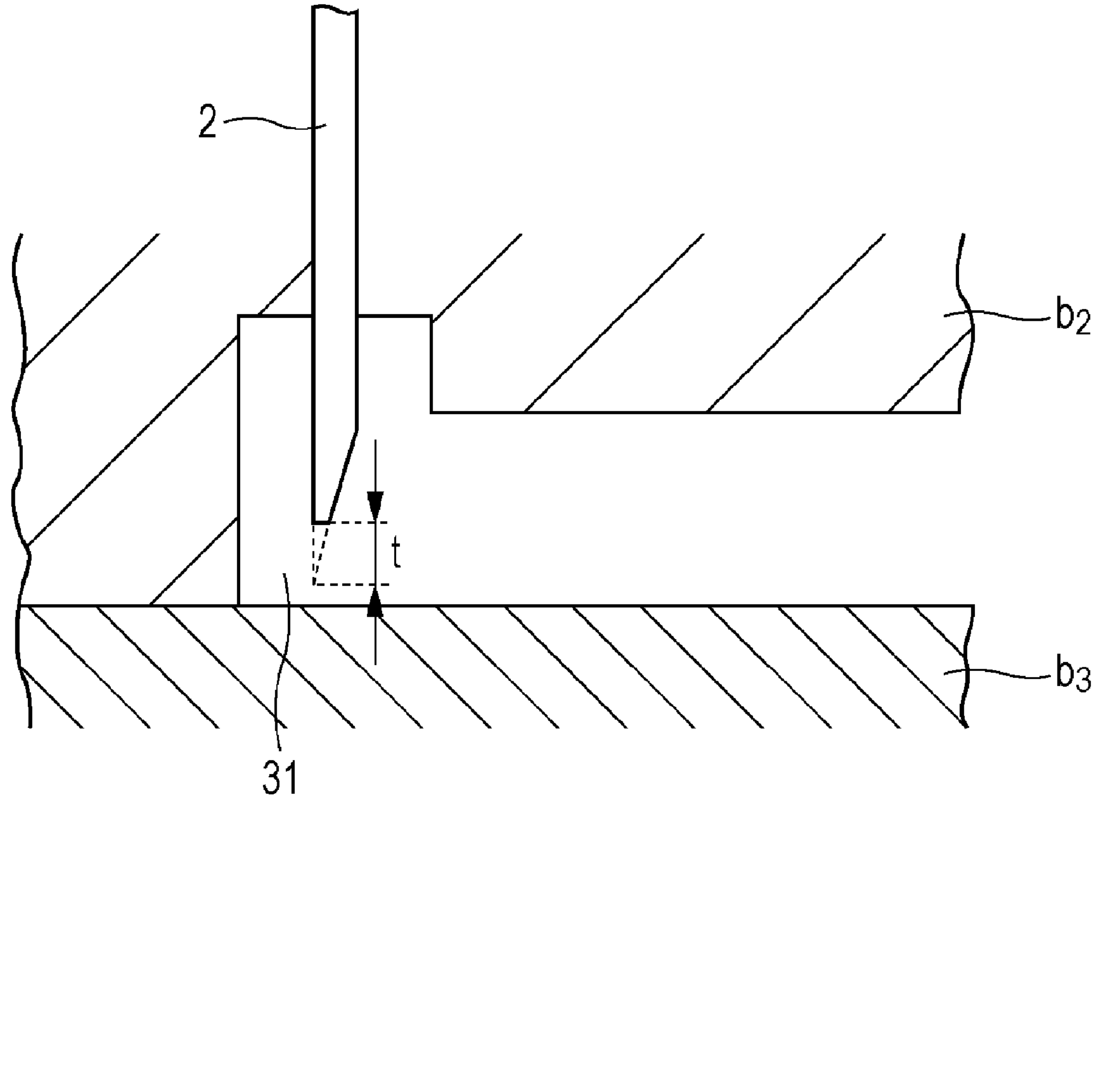
FIG. 12 is a sectional schematic view illustrating the configuration of a front end of a hollow needle.

In this instance, it is possible to stabilize the position of the front end of the hollow needle 2 which reaches the inner space of the injection portion 31 to abut against the surface of the substrate layer $b_3$, by machining the front end of the hollow needle 2 in a flat shape, as shown in FIG. 12. The front end of the hollow needle 2 may be machined by, for example, cutting a portion (refer to the symbol t in FIG. 12) of the front end of a painless needle.

Figure 11B:
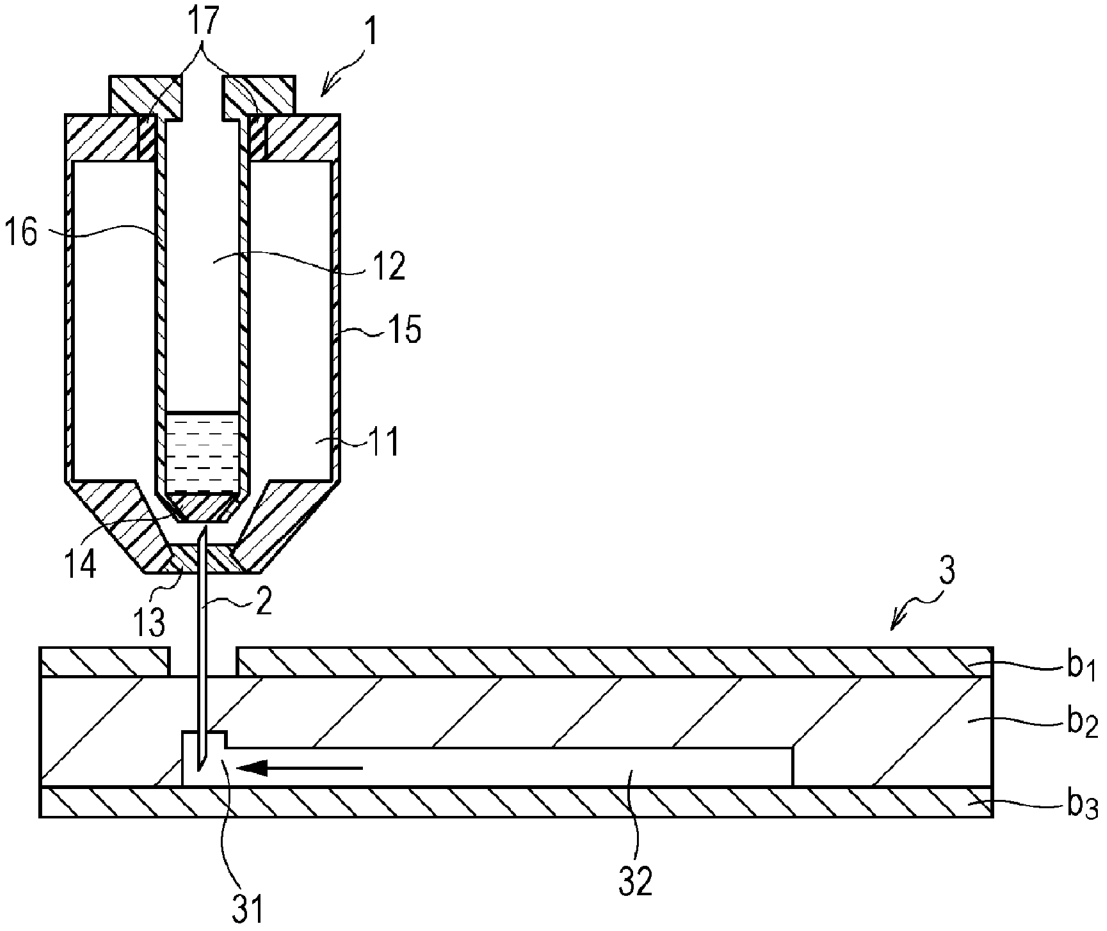

Next, one end of the hollow needle 2 penetrates the interior of the first region 11 from the first penetration portion 13 of the sample liquid supply container 1 in which the second region 12 is filled with the sample solution therein (refer to FIG. 11B). Since the first region 11 is depressurized therein, the front end of the hollow needle 2 reaches the interior of the first region 11, and when the interior of the first region 11 communicates with the interior of the injection region 31 through the hollow needle 2, the air inside the injection region (the injection portion 31, the main channel 32, the branch channel 33, the wells 34 and the terminal portion 35) is suctioned by the negative pressure inside the first region 11, so that the injection region is depressurized therein (refer to the arrow in FIG. 11B).

Figure 11C:
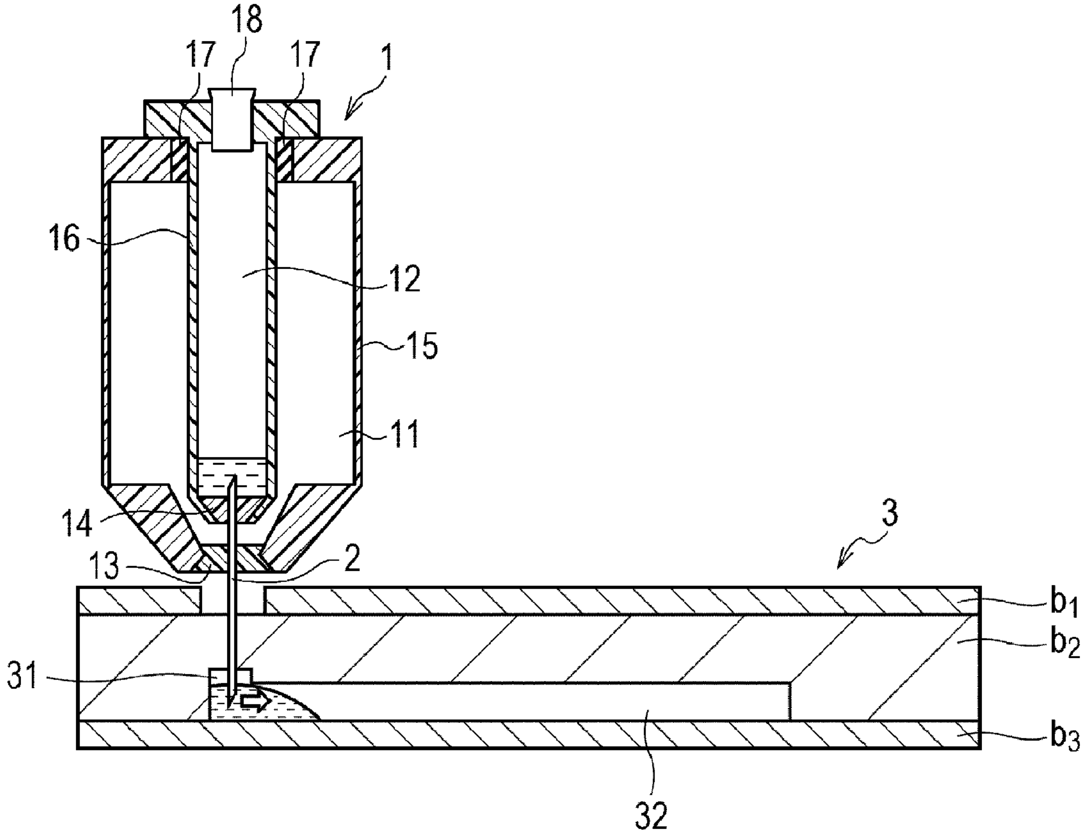
FIGS. 11C and 11D are sectional schematic views illustrating a process of introducing a sample solution to a microchip according to a second embodiment by using a sample liquid supply container according to a second embodiment.

Next, the front end of the hollow needle 2, which is inserted into the first penetration portion 13 to reach the interior of the first region 11, further penetrates the second region 12 from the second penetration portion 14 (refer to FIG. 11C). In this instance, since the injection region is depressurized therein, the front end of the hollow needle 2 reaches the second region 12, and when the interior of the second region 12 communicates with the interior of the injection region through the hollow needle 2, the sample solution inside the second region 12 is suctioned by the negative pressure inside the injection region, so that the sample solution is introduced into the interior of the injection region (refer to the block arrow in FIG. 11C).

In this way, the sample solution introduced from the injection portion 31 is fed to the terminal 35 through the main channel 32 (refer to the block arrow in FIG. 11C), and the sample solution is introduced into the interior in order from the branch channel 33 and the well 34 which are disposed at the upstream side in a liquid feeding direction (refer to FIG. 6). In this instance, since the interior of the injection portion 31, the main channel 32, the branch channel 33, the well 34 and the terminal portion 35 is depressurized, the sample solution introduced into the injection portion 31 is suctioned by the negative pressure, and thus is fed to the terminal portion 35.

As described above, with the microchip set according to the present disclosure, the air inside the injection region is able to be suctioned by the negative pressure inside the first region 11, and after the interior is depressurized, the sample solution inside the second region 12 is able to be introduced into the injection region by using the negative pressure of the injection region. Accordingly, the introduction of the sample solution is not disturbed by the air existing in the injection region, and the sample solution is able to be smoothly injected into the injection region by a series of operations in a short period of time. In addition, if the air in the injection region is completely suctioned, it is possible to introduce the sample solution without generating bubbles in the injection region.

Further, since the interior of the injection region is able to be depressurized by the negative pressure inside the first region 11, the attachment of the substrate layer $b_1$ to $b_3$ is carried out under the reduced pressure state (vacuum state). Therefore, it is possible to simplify the process of fabricating the microchip, as compared with the case where the injection region, such as the injection portion 31, is placed under negative pressure in advance. That is, in the microchip set according to the present disclosure, since the interior of the injection region is under normal pressures, the attachment of the substrate layers $b_1$ to $b_3$ is able to be carried out under the normal pressures.

Moreover, a method of exerting the negative pressure in advance onto the injection region by carrying out the attachment of the substrate layers under the reduced pressure has a problem in that a degree of reduced pressure in the injection region is lowered during a storage period of chips, or a problem in that the injection of the sample solution is conducted once. By contrast, in the microchip set according to the present disclosure, since the interior of the injection region is able to be depressurized by the negative pressure inside the first region 11 whenever the sample solution is injected, there is no problem in that a degree of the reduced pressure is lowered during the storage period, and it is possible to repeatedly conduct the injection of the sample solution.

Figure 11D:
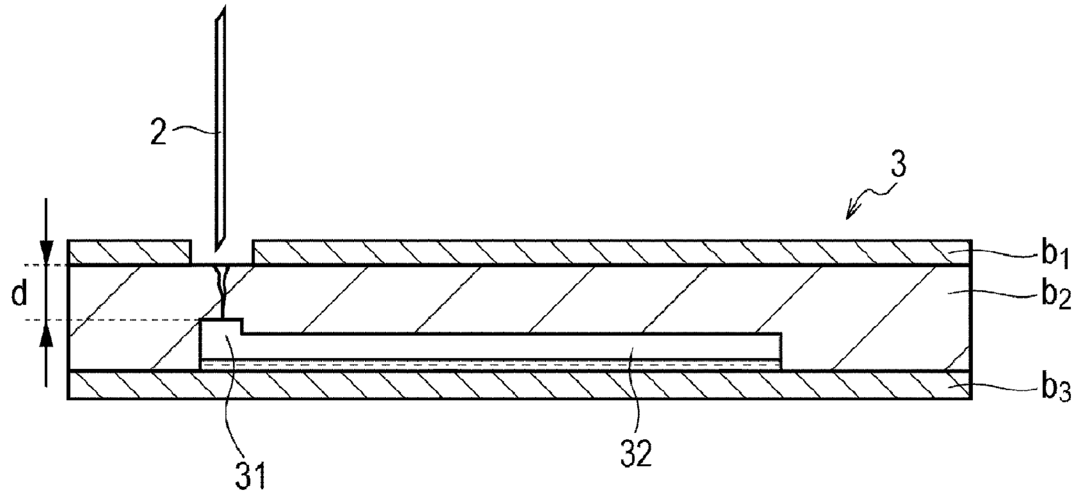

After the sample solution is introduced, as shown in FIG. 11D, the hollow needle 2 is withdrawn, and the punctured portion of the substrate layer $a_1$ is sealed. The sample liquid supply container 1 and the hollow needle 2 after use may be disposable.

In addition, since the substrate layer $b_2$ is made of the elastic material such as PDMS, the punctured portion is able to be naturally sealed by a restoring force of the substrate layer $a_1$ by elastic deformation thereof after the hollow needle 2 is withdrawn.

In order to improve the self-sealing ability of the substrate layer $b_2$, the thickness (refer to the symbol d in FIG. 11D) from the surface of the substrate layer $b_2$ to the surface of the inner space in the injection portion 31 in the punctured portion is necessarily set within an appropriate range depending upon the material of the substrate layer $b_2$ and the diameter of the hollow needle 2. In addition, in a case where the microchip 3 is heated at the time of analysis, it is necessary to set the thickness d so as not to lose the self-sealing ability due to the increased internal pressure resulting from the heating.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A sample liquid supply container comprising:

a first region which is depressurized therein and is hermetically sealed;

a second region which is able to receive a liquid therein;

a first penetration portion in which an interior of the first region is punctured by a hollow needle from outside; and a second penetration portion in which an interior of the second region is punctured by the hollow needle inserted into the first penetration portion and reached inside the first region.

2. The sample liquid supply container according to claim 1, wherein the first penetration portion and the second penetration portion are formed by a sealing member having airtightness and elasticity, through which the hollow needle is able to penetrate.

3. The sample liquid supply container according to claim 2, further comprising an inner cylinder forming the second region in an inner space, and an outer cylinder receiving at least a portion of the inner cylinder in the inner space, wherein the space formed by an outer surface of the inner cylinder and an inner surface of the outer cylinder is hermetically sealed to form the first region, and ends of the inner cylinder and the outer cylinder at the same side are sealed by the sealing member to form the first penetration portion and the second penetration portion.

4. A sample liquid supply container set comprising:

a hollow needle which penetrates an injection region which is an injection object of a liquid; and a sample liquid supply container including a first region which is depressurized therein and is hermetically sealed, a second region which is able to receive a liquid therein, a first penetration portion in which an interior of the first region is punctured by the hollow needle from outside, and a second penetration portion in which an interior of the second region is punctured by the hollow needle inserted into the first penetration portion and reached inside the first region.

5. A microchip set comprising:

a microchip provided with an injection region which is an injection object of a liquid and is hermetically sealed;

a hollow needle which penetrates an interior of the injection region from outside; and a sample liquid supply container including a first region which is depressurized therein and is hermetically sealed, a second region which is able to receive a liquid therein, a first penetration portion in which an interior of the first region is punctured by the hollow needle from outside, and a second penetration portion in which an interior of the second region is punctured by the hollow needle inserted into the first penetration portion and reaches inside the first region.

6. The microchip set according to claim 5, wherein the interior of the injection region is at a constant pressure.

7. The microchip set according to claim 6, wherein the portion, through which the hollow needle penetrates the interior of the injection region from the exterior, includes a substrate layer having elasticity, through which the hollow needle is able to penetrate, and a self-sealing ability which is created by elastic deformation.

8. The microchip set according to claim 7, wherein a substrate layer having a gas impermeable property is laminated on both surfaces of the substrate layer having the self-sealing ability which is caused by the elastic deformation, and the substrate layer having the gas impermeable property is provided with a punctured hole through which the hollow needle punctures the interior of the injection region from the exterior.

9. The microchip set according to claim 8, wherein the substrate layer having the self-sealing ability which is caused by the elastic deformation is made of a material which is selected from a group consisting of silicon-based elastomer, acrylic-based elastomer, urethane-based elastomer, fluorine-based elastomer, styrene-based elastomer, epoxy-based elastomer, and natural rubber.

10. The microchip set according to claim 9, wherein the substrate layer having the gas impermeable property is made of a material which is selected from a group consisting of glass, plastics, metals, and ceramics.

* * * * *